US011029437B2

(12) United States Patent
Imhof

(10) Patent No.: US 11,029,437 B2
(45) Date of Patent: Jun. 8, 2021

(54) SYSTEM, METHOD AND APPARATUS FOR PROVIDING AN IN-LINE BURIED WIRE GUIDANCE AMPLIFIER

(71) Applicant: Valmont Industries, Inc., Omaha, NE (US)

(72) Inventor: Lowell Imhof, Omaha, NE (US)

(73) Assignee: Valmont Industries, Inc., Omaha, NE (US)

( * ) Notice: Subject to any disclaimer, the term of this patent is extended or adjusted under 35 U.S.C. 154(b) by 65 days.

(21) Appl. No.: 16/409,924

(22) Filed: May 13, 2019

(65) Prior Publication Data

US 2019/0346583 A1  Nov. 14, 2019

Related U.S. Application Data

(60) Provisional application No. 62/671,024, filed on May 14, 2018.

(51) Int. Cl.
*G01V 3/08* (2006.01)
*G01V 3/12* (2006.01)
*G01R 29/08* (2006.01)

(52) U.S. Cl.
CPC .............. *G01V 3/08* (2013.01); *G01V 3/12* (2013.01); *G01R 29/085* (2013.01)

(58) Field of Classification Search
CPC ............ G01V 3/08; G01V 3/12; G01R 29/085
See application file for complete search history.

(56) References Cited

U.S. PATENT DOCUMENTS

| 4,043,418 | A | * | 8/1977 | Blakeslee | ................ | B62D 1/28 |
| | | | | | | 180/168 |
| 6,819,115 | B1 | * | 11/2004 | Keefe | ................... | G01R 29/085 |
| | | | | | | 324/527 |
| 2004/0264220 | A1 | * | 12/2004 | Briere | ..................... | H02M 1/44 |
| | | | | | | 363/39 |

* cited by examiner

*Primary Examiner* — Tung X Nguyen
*Assistant Examiner* — Feba Pothen
(74) *Attorney, Agent, or Firm* — Milligan PC LLO

(57) ABSTRACT

The present invention provides a filter which is configured to filter frequencies created by noise outside of the band of interest and to then amplify the filtered signal to allow a weaker signal to be used for guidance. According to a first preferred embodiment, the filter of the present invention includes a 5th order active high pass filter cascaded with a 5th order active low pass filter. According to a further preferred embodiment, the filter of the present invention preferably provides a cutoff of frequencies below 700 Hz and above 1500 Hz. According to a further preferred embodiment, the filter of the present invention further uses a voltage amplifying circuit to amplify the filtered signal.

14 Claims, 4 Drawing Sheets

SYSTEM, METHOD AND APPARATUS FOR PROVIDING AN IN-LINE BURIED WIRE GUIDANCE AMPLIFIER

RELATED APPLICATIONS

The present application claims priority to U.S. Provisional Application No. 62/671,024 filed May 14, 2018.

BACKGROUND AND FIELD OF THE PRESENT INVENTION

Field of the Present Invention

The present invention relates generally to a system and method for controlling mechanized irrigation machines and, more particularly, to a system and method for detecting and identifying buried wire within an irrigation field.

Background of the Invention

Currently, many irrigation machines, especially corner machines and linear carts are guided by electrical wires which are buried in fields to be irrigated. These buried wires carry an electrical signal created by an oscillator operating at a particular frequency. The oscillator box is generally mounted at a central pivot control panel and an antenna array is mounted on one or more guidance towers.

In operation, the oscillator box creates a signal that is transmitted through the buried wire and this signal is received by detection antenna within one or more antenna boxes. This detected signal is then delivered to a guidance control box which includes a guidance receiver. The guidance receiver determines the location of the guidance tower in relationship to the buried wire and the panel controller commands steering of the freestanding span to follow the wire. Most commonly, ferrite core, tuned circuit antennae mounted to the irrigation machine are used to detect the oscillating electromagnetic signal emanating from the buried wire. Generally, the detection antenna may be located on an outer portion of an irrigation span such as the steerable drive unit of a corner arm, or on the first span next to the linear cart.

A reference antenna, typically located directly above the buried wire is utilized to detect the presence of a signal from the buried wire. The signals from the antennas are analog and are directed to an analog device called a guidance receiver. If a signal is present, the guidance receiver utilizes input from one or more steering antennae, typically located off to the side and at an angle to the reference antenna, to determine the horizontal offset (error) of the reference antenna relative to the buried wire. This is accomplished within the guidance receiver by comparing the difference in amplitude and phase angle of the signal between the steering and reference antennae. This offset value is then used to command the machine to initiate a steering action to bring the reference antenna directly over the guidance wire.

This type of guidance design has a number of limitations which impairs reliable location detection. In particular, this system suffers from poor signal strength over distances exceeding 8-10 feet. This is especially true when operating in high vegetative density crops such as corn or when there are sources of electrical interference such as high current power lines. Further, this type of guidance system has difficulty detecting underground wires when there are nearby obstructions in the ground such as neighboring buried wires and underground pipes. Further, the system suffers from other sources of electrical interference such as radio frequency noise from nearby radio stations and power line harmonics often caused by variable-frequency drives, soft starts and the like.

SUMMARY OF THE PRESENT INVENTION

To address the shortcomings presented in the prior art, the present invention provides a filter which is configured to filter frequencies created by noise outside of the band of interest and to then amplify the filtered signal so as to allow a weaker signal (due to increased distance or attenuation due to crop vegetation) to be used for guidance. According to a first preferred embodiment, the filter of the present invention includes a 5th order active high pass filter cascaded with a 5th order active low pass filter. According to a further preferred embodiment, the filter of the present invention preferably provides a cutoff of frequencies below 700 Hz and above 1500 Hz. According to a further preferred embodiment, the filter of the present invention preferably further uses a voltage amplifying circuit to amplify the filtered signal.

As discussed further herein, the filter/amplifier of the present invention allows buried wire guidance to be utilized on ultra-high profile linear machines with crop clearances greater than 10 ft. In addition, the device allows buried wire guidance to be utilized in areas where underground pipelines or high voltage power lines are nearby.

The accompanying drawings, which are incorporated in and constitute part of the specification, illustrate various embodiments of the present invention and together with the description, serve to explain the principles of the present invention.

DESCRIPTION OF THE PREFERRED EMBODIMENTS

Figure 1:
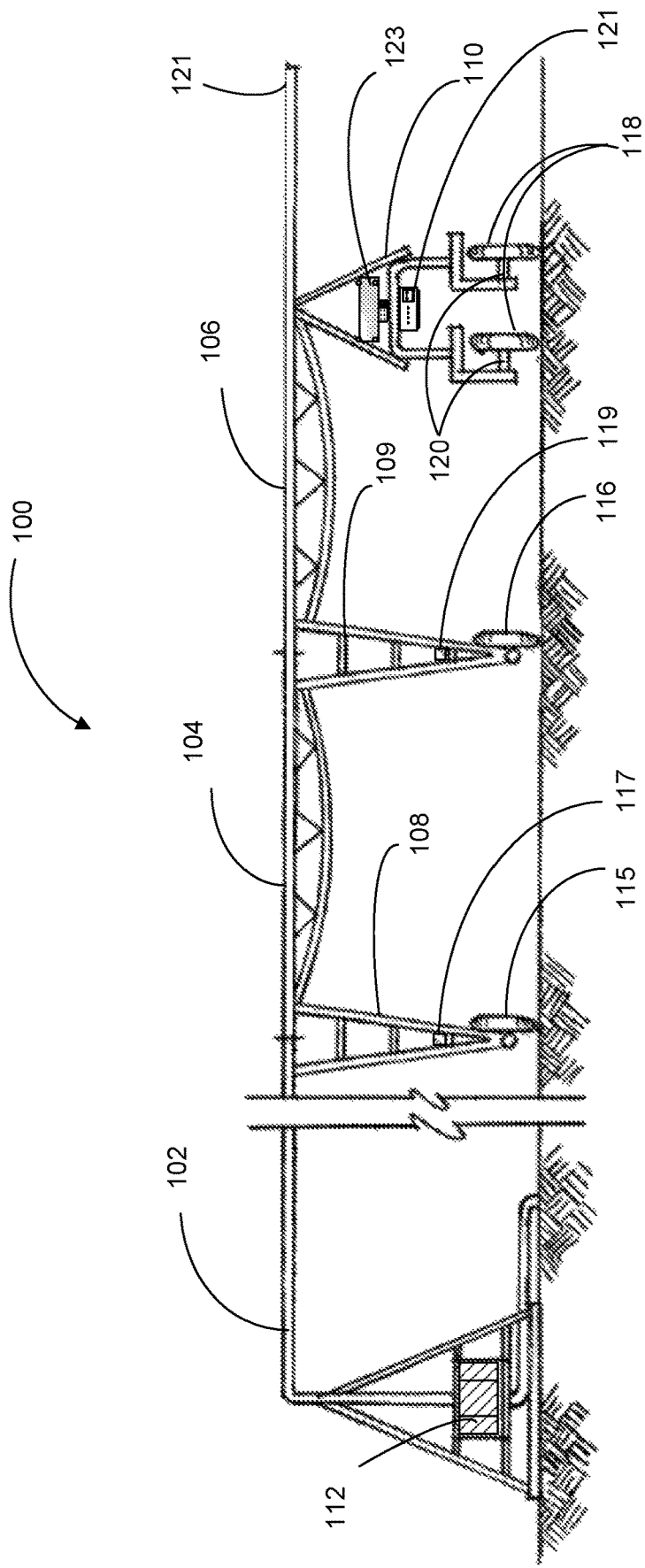
FIG. 1 shows a block diagram of a system in accordance with an embodiment of the present invention.

For the purposes of promoting an understanding of the principles of the present invention, reference will now be made to the embodiments illustrated in the drawings and specific language will be used to describe the same. It will nevertheless be understood that no limitation of the scope of the present invention is hereby intended and such alterations and further modifications in the illustrated devices are contemplated as would normally occur to one skilled in the art.

The terms "program," "computer program," "software application," "module" and the like as used herein, are defined as a sequence of instructions designed for execution on a computer system. A program, computer program, module or software application may include a subroutine, a function, a procedure, an object implementation, an executable application, an applet, a servlet, a source code, an object code, a shared library, a dynamic load library and/or other sequence of instructions designed for execution on a computer system. A data storage means, as defined herein, includes many different types of computer readable media that allow a computer to read data therefrom and that maintain the data stored for the computer to be able to read the data again. Such data storage means can include, for example, non-volatile memory, such as ROM, Flash memory, battery backed-up RAM, Disk drive memory, CD-ROM, DVD, and other permanent storage media. However, even volatile storage such a RAM, buffers, cache memory, and network circuits are contemplated to serve as such data storage means according to different embodiments of the present invention.

FIG. 1 illustrates an exemplary self-propelled irrigation system 100 which may be used with example implementations of the present invention. As should be understood, the irrigation system 100 disclosed in FIG. 1 is an exemplary irrigation system onto which the features of the present invention may be integrated. Accordingly, FIG. 1 is intended to be purely illustrative and any of a variety of systems (i.e. fixed systems as well as linear and center pivot self-propelled irrigation systems; stationary systems; corner systems) may be used with the present invention without limitation. For example, although FIG. 1 is shown as a center pivot irrigation system, the exemplary irrigation system 100 of the present invention may also be implemented as a linear irrigation system. The example irrigation system 100 is not intended to limit or define the scope of the present invention in any way. According to further preferred embodiments, the present invention may be used with a variety of motor types such as gas powered, DC powered, switched reluctance, single phase AC and the like.

With reference now to FIG. 1, spans 102, 104, 106 are shown supported by drive towers 108, 109, 110. Further, each drive tower 108, 109, 110 is shown with respective motors 117, 119, 120 which provide torque to the drive wheels 115, 116, 118. According to alternative embodiments of the present invention, a single irrigation machine may use one or more drive towers in accordance with the present invention in combination with any of a variety of other types of drive towers (including unmotorized) without departing from the scope of the present invention.

As further shown in FIG. 1, the irrigation machine 100 may preferably further include an extension/overhang 121 which may include an end gun (not shown). In an implementation, the end gun is a suitable pressure sprayer configured to be activated at the corners of a field or other designated area to increase the amount of land that can be irrigated. As further shown in FIG. 1, the exemplary system 100 of the present invention may preferably further include a buried wired guidance system. More specifically, the exemplary system 100 of the present invention may preferably include an antenna array 123 which preferably detects the relative position of the last regular drive unit 110 (or other selected drive tower) to a buried wire (not shown). According to a further preferred embodiment, the signals and relative positions detected by the antenna array 123 are preferably forwarded to a guidance receiver 121 mounted on the steerable or master drive unit 110 for processing and evaluation.

Figure 2:
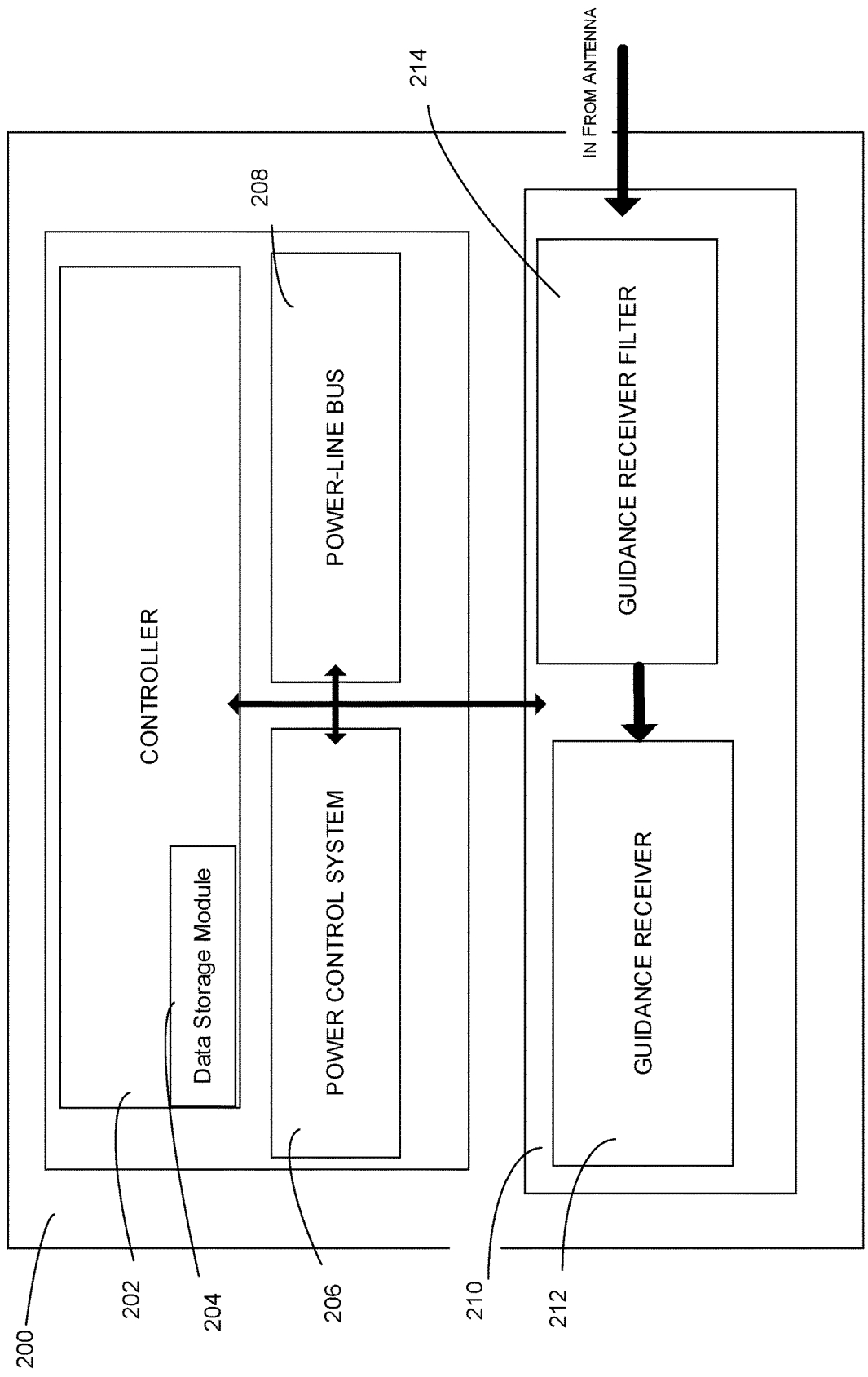
FIG. 2 illustrates a block diagram of an exemplary control panel for use with the present invention.

With reference now to FIG. 2, an exemplary control device 200 which represents functionality to control one or more operational aspects of the irrigation system 100 will now be discussed. According to a preferred embodiment, the exemplary control device 200 preferably may reside within a guidance assembly enclosure 121, the pivot control panel 112 or other centralized, powered location. Further, the components and modules of the control device 200 may be distributed among multiple, different enclosures. As further shown, the exemplary control device 200 may preferably further include a processor/controller 202 having a storage/memory module 204. The processor/controller 202 preferably provides processing functionality for the control device 200 and may include any number of processors, microcontrollers, or other processing systems. The processor/controller 202 may execute one or more software programs that implement techniques described herein. The storage/memory module 204 is an example of tangible computer-readable media that provides storage functionality to store various data associated with the operation of the control device 200, such as the software program and code segments mentioned above, or other data to instruct the processor/controller 202 and other elements of the control device 200 to perform the steps described herein. The storage/memory module 204 may include, for example, removable and non-removable memory elements such as RAM, ROM, Flash (e.g., SD Card, mini-SD card, micro-SD Card), magnetic, optical, USB memory devices, and so forth.

In implementations, exemplary control device 200 preferably further includes a power control system 206 and a power-line BUS 208 which may include conductive transmission lines, circuits and the like for controlling and routing electric power, controlling its quality, and controlling the devices attached to a power-line carrier system as discussed further below. Further, the system of the present invention preferably may further include a guidance control box 210 which preferably includes a guidance receiver 212 for receiving signals from the antenna array (shown as 123 in FIG. 1). According to a further preferred embodiment of the present invention, the guidance control box 210 of the present invention may preferably further include a guidance receiver filter 214. According to preferred embodiments of the present invention, the guidance receiver filter 214 of the present invention preferably receives signals from the antenna array and filters/amplifies the signals and forwards the signals to the guidance receiver 212.

Figure 4:
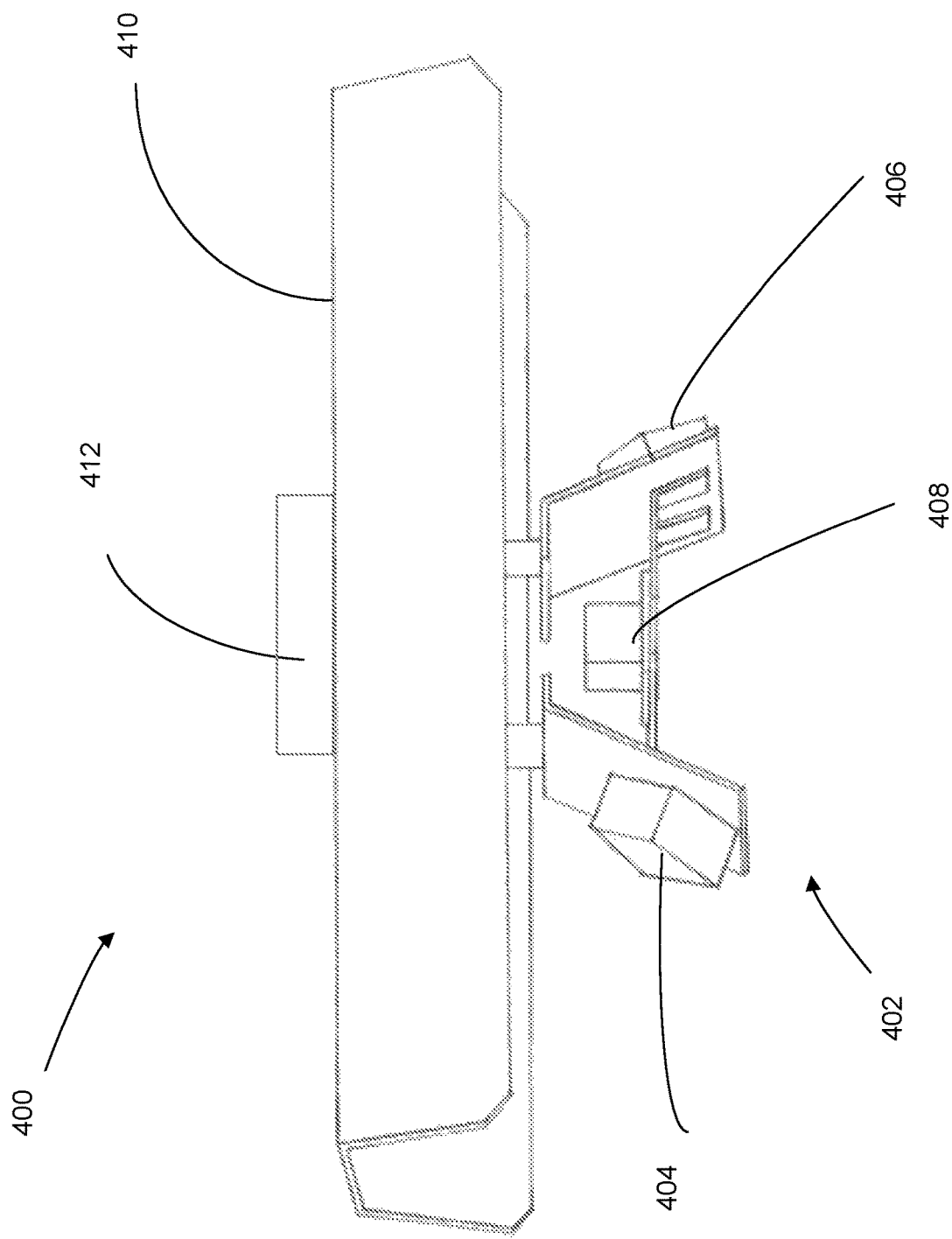
FIG. 4 shown an exemplary circuit design in accordance with a preferred embodiment of the present invention.

With reference now to FIG. 4, an exemplary antenna assembly 400 in accordance with a preferred embodiment of the present invention will now be further discussed. As shown in FIG. 4, the exemplary antenna assembly 400 of the present invention is preferably attached to a drive tower at a connection point 412. As further shown, the exemplary antenna assembly 400 preferably further includes an antenna shield 410 and antenna array 402. As further shown, the exemplary antenna array 402 of the present invention may preferably include a pair of steering antennas 404, 406 and a reference antenna 408. Preferably, the steering antennas 404, 406 and the reference antenna 408 receive signals from the buried guidance wire and send electrical signals to the guidance receiver 212 in the control panel 200. Preferably, the signal is monitored by the guidance receiver 212 which interfaces with the controller 202 and the power control system 206 to keep the corner over the guidance wire or to shut the machine down should the corner to move outside the guidance safety limits.

Figure 3:
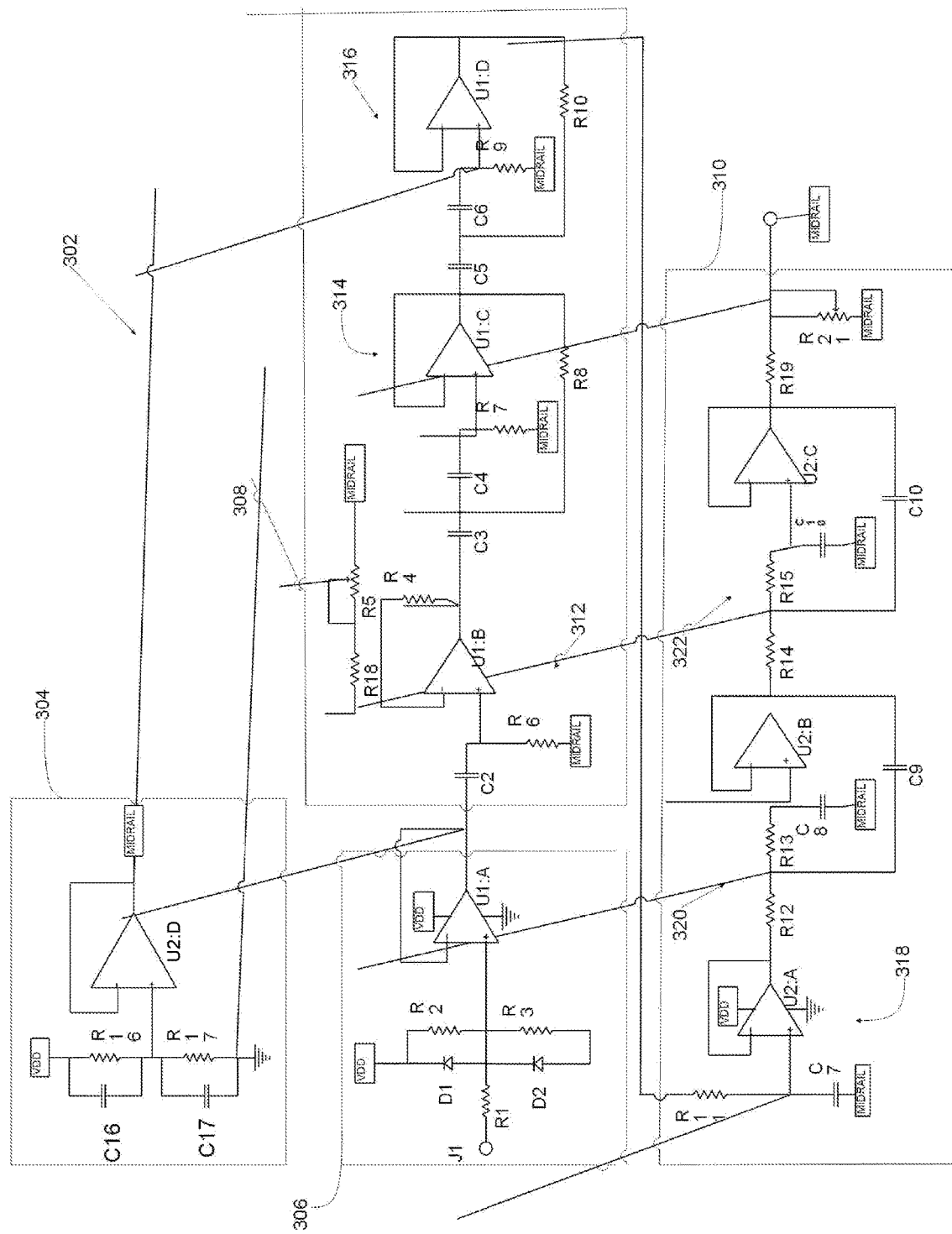
FIG. 3 shows an exemplary antenna array for use with an embodiment of the present invention.

Referring now to FIG. 3, a schematic of an exemplary guidance receiver filter 302 of the present invention (shown as guidance receiver filter 214 in FIG. 2) shall now be discussed. As shown in FIG. 2, the guidance receiver filter 214/302 is preferably interposed between the antenna array 402 (shown in FIG. 4) and the guidance receiver 212.

As discussed above, the guidance receiver filter 302 of the present invention preferably removes noise signals that are outside the frequency band of interest (for example outside the frequency band between 700 Hz and 1500 Hz), and amplifies the antenna signals within the band of interest so that weaker signals, which may have been attenuated due to distance or interference from increased crop vegetation between the transmitter and reference and steering antennas, may be used for guidance. The guidance receiver filter 302 preferably includes a rail splitting circuit 304; an input signal buffer circuit 306, a $5^{th}$ order high pass filter/amplifier circuit 308; and a $5^{th}$ order low pass filter/amplifier circuit 310.

As shown, the rail splitting circuit 304 of the present invention preferably includes a voltage divider created by a pair of identical resistors, R16 and R17, connected in series between the supply voltage $V_{DD}$ and ground. Since resistors R16 and R17 have equal resistance, the voltage drop across each resistor is the same, effectively dividing the supply voltage $V_{DD}$ in half. Capacitors C16 and C17 are each connected in parallel with resistors R16 and R17, respectively, to remove transients from the supply voltage. As shown, non-inverting op amp U2:D is preferably connected in a simple voltage follower configuration. The circuit node created by the junction of resistors R16 and R17 is preferably connected to the non-inverting terminal of op amp U2:D. The output of op amp U2:D is preferably fed back directly to the inverting terminal of the op amp. In this exemplary configuration, the output of op amp U2:D preferably follows the voltage present on the non-inverting input terminal, namely ½ $V_{DD}$. The rail splitting circuit 304 preferably further provides a stable isolated MIDRAIL voltage to the guidance receiver filter 302 as described below.

According to further preferred embodiments, the input signal buffer 306 is preferably configured in a manner similar to that of the rail splitting circuit 304. Accordingly, as shown, a pair of identical resistors, R2, R3 are connected in series between the supply voltage $V_{DD}$ and ground, dividing the supply voltage in half. The input signal received from the reference and steering antennas is input to the guidance receiver filter 302 at pin J1. The input signal is connected by way of a current limiting resistor R1 to the circuit node created by the junction of resistors R2 and R3. That same node is preferably connected to the non-inverting input of buffering op amp U1:A. Further, a pair of voltage limiting diodes D1 and D2 are preferably connecting in parallel with the resistors R2 and R3 to protect against excessive amplitude swings of the input voltage signal. As further shown, the buffering op amp U1:A is preferably configured as a simple voltage follower, with the output of the device fed back directly to the inverting terminal of the device. In this configuration the output of the buffering circuit 306 preferably provides an isolated voltage signal that follows the voltage of the input signal received from reference and steering antennas centered about the MID-RAIL voltage.

The output of the buffer circuit 306 is preferably input directly to the $5^{th}$ order high pass filter/amplifier circuit 308. The $5^{th}$ order high pass filter/amplifier circuit 308 itself preferably includes a $1^{st}$ order high pass filter/amplifier circuit 312 cascaded with two second order high pass filter circuits 314, 316. The $1^{st}$ order high pass filter/amplifier circuit 312 preferably includes an RC network formed by capacitor C2 and resistor R6. The values of C2 and R6 may be selected according to the desired cut-off frequency for the filter. The circuit node formed by the junction between capacitor C2 and resistor R6 is connected to the non-inverting input of op amp U1:B. The output of op amp U1:B is fed back to the inverting terminal of the device through resistor R4. The inverting terminal of op amp U1:B is further connected to the MIDRAIL voltage output from the voltage splitting circuit 304 through resistors R18 and R5. Resistor R5 is a variable resistor that may be manipulated to adjust the gain of the $1^{st}$ order high pass filter/amplifier circuit 312. The output of the $1^{st}$ order high pass filter/amplifier circuit is input to the first $2^{nd}$ order high pass filter circuit 314.

The first $2^{nd}$ order high pass filter circuit 314 preferably includes an RC network formed by resistor R7 and capacitors C3 and C4; the op amp U1:C; and feedback resistor R8. The circuit node formed by the junction between capacitor C4 and resistor R7 is connected to the non-inverting input of op amp U1:C. The output of op amp U1:C is fed back directly to the inverting terminal of the op amp. The output of op amp U1:C is also connected to the circuit node formed by the junction of capacitors C3 and C4 through feedback resistor R8. Finally, the output of op amp U1:C is input to the second $2^{nd}$ order high pass filter circuit 316. The output of op amp U1:C follows the voltage across resistor R7. The frequency response of the RC network comprising C3, C4 and R7 is similar to that of the RC network comprising C2 and R6 of the $1^{st}$ order high pass filter, but with a steeper stop band roll off below the cutoff frequency. In other words, the $2^{nd}$ order high pass filter circuit 314 further refines the output characteristics of $5^{th}$ order high pass filter.

Similar to the first $2^{nd}$ order high pass filter circuit 314, the second $2^{nd}$ order high pass filter circuit 316 preferably includes an RC network formed by resistor R9 and capacitors C5 and C6; the op amp U1:D; and feedback resistor R10. The circuit node formed by the junction between capacitor C6 and resistor R9 is connected to the non-inverting input of op amp U1:D. The output of op amp U1:D is fed back directly to the inverting terminal of the op amp. The output of op amp U1:D is also connected to the circuit node formed by the junction of capacitors C5 and C6 through feedback resistor R10. As with the first $2^{nd}$ order high pass filter circuit 314, the second $2^{nd}$ order high pass filter circuit 316 further refines the output characteristics of the $5^{th}$ order high pass filter/amplifier 308.

The output of op amp U1:D constitutes the output of the $5^{th}$ order high pass filter/amplifier 308 and is input directly to the $5^{th}$ order low pass filter/amplifier 310. Like the $5^{th}$ order high pass filter/amplifier 308, the $5^{th}$ order low pass filter 310 preferably includes a $1^{st}$ order lowpass filter circuit 318 cascaded with two $2^{nd}$ order low pass frequency circuits 320, 322. The $1^{st}$ order low pass filter circuit 318 preferably includes an RC input circuit formed by resistor R11 and capacitor C7. The circuit node formed by the junction of resistor R11 and capacitor C7 is connected to the non-inverting input of op amp U2:A. The output of Op amp U2:A is fed back directly to the inverting input of the op amp U2:A. The cut off frequency of the $1^{st}$ order low pass filter is determined by the values of resistor R11 and capacitor C7.

The output of the $1^{st}$ order low pass filter circuit 318 fed into the first $2^{nd}$ order lowpass filter circuit 320. The first $2^{nd}$ order lowpass filter preferably includes an RC network formed by resistors R12 and R13 and capacitor C8. The circuit node formed by the junction of the resistor R13 and capacitor C8 is connected to the non-inverting input of op amp U2:B. The output of op amp U2:B is fed back directly to the inverting input of the op amp. The output of op amp U2:B is also fed back to the circuit node formed by the junction of resistors R12 and R13 through capacitor C9. Capacitor C8 may selected to have the same capacitance as capacitor C7. In this case, the first $2^{nd}$ order low pass filter circuit 320 will have substantially the same frequency response as the $1^{st}$ order low pass filter circuit 318, but with a steeper stop band roll off.

The second 2$^{nd}$ order low pass filter circuit 322 is substantially identical to the first 2$^{nd}$ order low pass filter circuit 320, comprising an RC network formed by resistors R14 and R15 and capacitor C10. The circuit node formed by the junction of the resistor R15 and capacitor C10 is connected to the non-inverting input of op amp U2:C. The output of op amp U2:D is fed back directly to the inverting input of the op amp. The output of op amp U2:B is also fed back to the circuit node formed by the junction of resistors R14 and R15 through capacitor C11. The second 2$^{nd}$ order low pass filter circuit 320 further refines the frequency response output of the 5$^{th}$ order low pass filter 310.

The output of the op amp U2:C is further connected to a resistor network comprising fixed resistor R19 and adjustable resistor R21. The resistance of the variable resistor R21 may be manipulated to adjust the voltage gain of the 2$^{nd}$ order low pass filter/amplifier circuit 322. The circuit node created by the junction of resistors R19 and R21 forms the output of the filter/amplifier device 302.

While the above descriptions regarding the present invention contain much specificity, these should not be construed as limitations on the scope, but rather as examples. Many other variations are possible. Accordingly, the scope should be determined not by the embodiments illustrated, but by the appended claims and their legal equivalents.

What is claimed is:

1. A system for detecting a location of a buried wire, wherein the system comprises:
   an antenna array, wherein the antenna array is comprised of a first steering antenna, a second steering antenna; and a reference antenna; wherein the reference antenna is positioned between the first steering antenna and the second steering antenna;
   a guidance receiver, wherein the guidance receiver is configured to receive and process signals from the antenna array to determine the relative position of the antenna array to the buried wire; and
   a guidance receiver filter; wherein the guidance receiver filter is interposed between the antenna array and the guidance receiver; wherein the guidance receiver filter is comprised of a 5th order active high pass filter cascaded with a 5th order active low pass filter to produce a filtered signal;
   wherein the guidance receiver filter is configured to cutoff of frequencies below 700 Hz and above 1500 Hz;
   wherein the guidance receiver filter comprises a voltage amplifying circuit; wherein the guidance receiver filter comprises a rail splitting circuit; wherein the guidance receiver filter comprises an input signal buffer circuit;
   wherein the 5th order active high pass filter comprises a 5th order high pass filter/amplifier circuit; wherein the 5th order active low pass filter comprises a 5th order low pass filter/amplifier circuit;
   wherein the rail splitting circuit comprises a voltage divider and a first non-inverting operational amplifier;
   wherein the voltage divider comprises a first resistor and a second resistor connected in series between a supply voltage and a grounding element;
   wherein the rail splitting circuit further comprises a first capacitor connected in parallel with the first resistor and a second capacitor connected in parallel with the second resistor;
   wherein the 5th order high pass filter/amplifier circuit comprises a 1st order high pass filter/amplifier circuit cascaded with a first 2nd order high pass filter circuit and a second 2nd order high pass filter circuit.

2. The system of claim 1, wherein the 1st order high pass filter/amplifier circuit comprises an RC network formed by a third capacitor and a third resistor.

3. The system of claim 2, wherein the 1st order high pass filter/amplifier circuit comprises a variable resistor which is configured to adjust the gain of the 1st order high pass filter/amplifier circuit.

4. The system of claim 3, wherein the first 2nd order high pass filter circuit comprises an RC network formed by a fourth resistor, a fourth capacitor, a fifth capacitor, a first operational amplifier and a first feedback resistor.

5. The system of claim 4, wherein the second 2nd order high pass filter circuit comprises an RC network formed by a fifth resistor, a sixth capacitor, a seventh capacitor, a second operational amplifier and a second feedback resistor.

6. The system of claim 5, wherein the 5$^{th}$ order low pass filter/amplifier circuit is configured to receive input directly from the 5$^{th}$ order high pass filter/amplifier circuit.

7. The system of claim 6, wherein the 5$^{th}$ order low pass filter/amplifier circuit comprises a first low pass filter/amplifier circuit cascaded with a first 2$^{nd}$ order low pass filter circuit and a second 2$^{nd}$ order lowpass filter circuit.

8. The system of claim 7, wherein 5$^{th}$ order low pass filter/amplifier circuit comprises an output connected to a resistor network comprising a fixed resistor and an adjustable resistor.

9. The system of claim 8, wherein the resistance of the adjustable resistor is configured to adjust the voltage gain of the 2$^{nd}$ order low pass filter/amplifier circuit.

10. A system for detecting a location of a buried wire, wherein the system comprises:
    an antenna array, wherein the antenna array is comprised of a first steering antenna, a second steering antenna; and a reference antenna; wherein the reference antenna is positioned between the first steering antenna and the second steering antenna;
    a guidance receiver, wherein the guidance receiver is configured to receive and process signals from the antenna array to determine the relative position of the antenna array to the buried wire; and
    a guidance receiver filter; wherein the guidance receiver filter is interposed between the antenna array and the guidance receiver; wherein the guidance receiver filter is comprised of a 5th order active high pass filter cascaded with a 5th order active low pass filter to produce a filtered signal;
    wherein the guidance receiver filter is configured to cutoff of frequencies below 700 Hz and above 1500 Hz;
    wherein the guidance receiver filter comprises a voltage amplifying circuit;
    wherein the 5th order active high pass filter comprises a 5th order high pass filter/amplifier circuit; wherein the 5th order active low pass filter comprises a 5th order low pass filter/amplifier circuit;
    wherein the 5th order high pass filter/amplifier circuit comprises a 1st order high pass filter/amplifier circuit cascaded with a first 2nd order high pass filter circuit and a second 2nd order high pass filter circuit.

11. The system of claim 10, wherein the guidance receiver filter comprises a rail splitting circuit; wherein the guidance receiver filter comprises an input signal buffer circuit.

12. The system of claim 11, wherein the rail splitting circuit comprises a voltage divider and a first non-inverting operational amplifier.

13. The system of claim 12, wherein the voltage divider comprises a first resistor and a second resistor connected in series between a supply voltage and a grounding element.

14. The system of claim 13, wherein the rail splitting circuit further comprises a first capacitor connected in parallel with the first resistor and a second capacitor connected in parallel with the second resistor.

* * * * *